United States Patent
Kusuda et al.

(10) Patent No.: US 6,856,762 B2
(45) Date of Patent: Feb. 15, 2005

(54) LIGHT IRRADIATION TYPE THERMAL PROCESSING APPARATUS

(75) Inventors: Tatsufumi Kusuda, Kyoto (JP); Hiromi Murayama, Kyoto (JP); Yasuhiro Imaoka, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/645,067

(22) Filed: Aug. 21, 2003

(65) Prior Publication Data

US 2004/0037543 A1 Feb. 26, 2004

(30) Foreign Application Priority Data

Aug. 21, 2002 (JP) ........................................ 2002-240438
Mar. 27, 2003 (JP) ........................................ 2003-088371

(51) Int. Cl.⁷ .............................................. F26B 19/00
(52) U.S. Cl. ...................... 392/416; 392/418; 219/390; 219/405; 219/411
(58) Field of Search ................................ 219/390, 405, 219/411; 392/416, 418; 118/724, 725, 50.1, 728, 729

(56) References Cited

U.S. PATENT DOCUMENTS

| | | | | |
|---|---|---|---|---|
| 4,571,486 A | * | 2/1986 | Arai et al. ................... | 438/799 |
| 4,649,261 A | | 3/1987 | Sheets | |
| 6,437,290 B1 | * | 8/2002 | Shao et al. .................. | 219/390 |

FOREIGN PATENT DOCUMENTS

| | | |
|---|---|---|
| JP | 57-162340 | 10/1982 |
| JP | 59-169125 | 9/1984 |
| JP | 60-258928 | 12/1985 |
| JP | 63-166219 | 7/1988 |
| JP | 2001-237195 | 8/2001 |
| JP | 2002-110579 | 4/2002 |
| JP | 2002-110580 | 4/2002 |

OTHER PUBLICATIONS

English translation of Abstract for Japanese Patent Application Laid Open No. 2002–110579.
English translation of Abstract for Japanese Patent Application Laid Open No. 2002–110580.
English translation of Abstract for Japanese Patent Application Laid Open No. 2001–237195.
English translation of Abstract for Japanese Patent Application Laid Open No. 57–162340.
English translation of Abstract for Japanese Patent Application Laid Open No. 63–166219.
Japanese Patent Application Laid Open No. 59–169125 which corresponds to U.S. Patent No. 4,571,486 (as listed above).
Japanese Patent Application Laid Open No. 60–258928 which corresponds to U.S. Patent No. 4,649,261 (as listed above).

* cited by examiner

*Primary Examiner*—Shawntina Fuqua
(74) *Attorney, Agent, or Firm*—Ostrolenk, Faber, Gerb & Soffen, LLP

(57) ABSTRACT

In a light diffuser, a strong light diffusion processing is performed to a lamp corresponding part located in a vertical immediate downward direction of each of a plurality of flash lamps, and a weak light diffusion processing is performed to an inter-lamp corresponding part located between lamp corresponding parts adjacent to each other. Thereby, the light transmittance of the lamp corresponding part is lower than that of the inter-lamp corresponding part. Light that is emitted from each of the flash lamps and directed to a vertical immediate downward direction is diffused intensely, while reducing the degree of light diffusion at a location immediately below space between the adjacent flash lamps, thereby improving in-plane uniformity of illumination distribution on a semiconductor wafer. This enables to provide a thermal processing apparatus capable of improving in-plane uniformity of illumination distribution on a substrate.

13 Claims, 10 Drawing Sheets

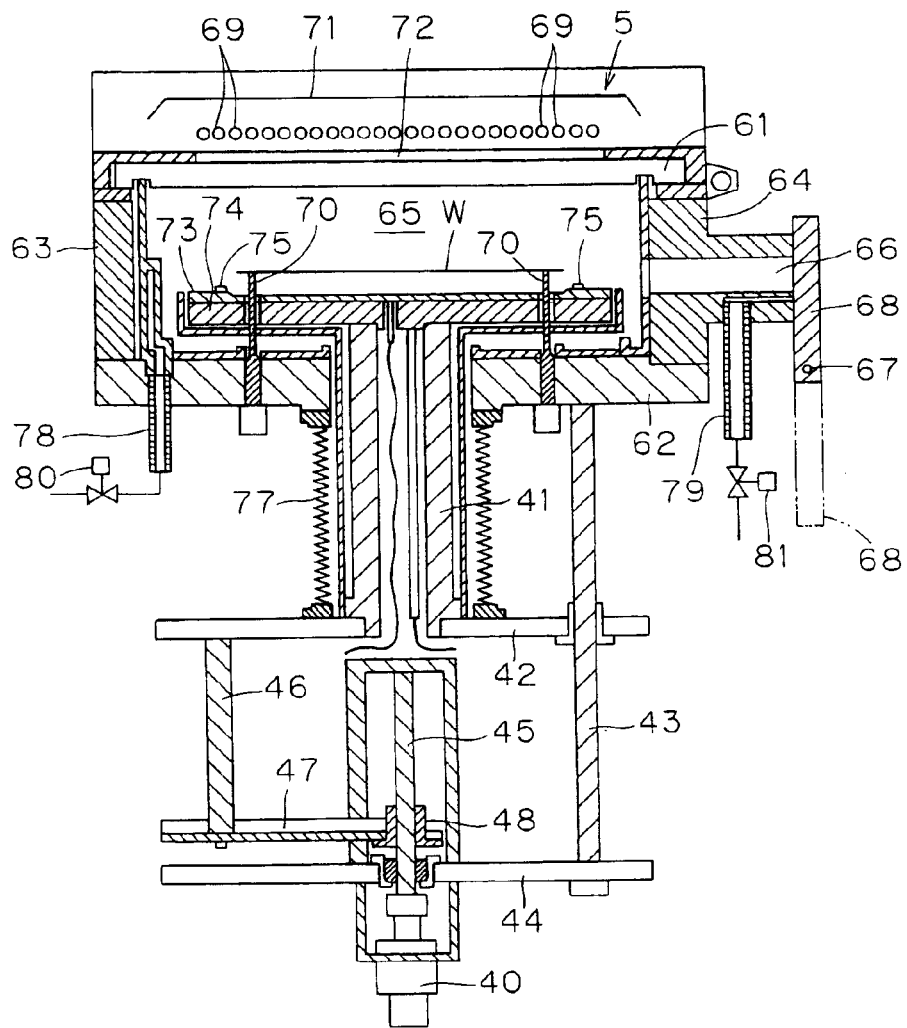
F I G . 1

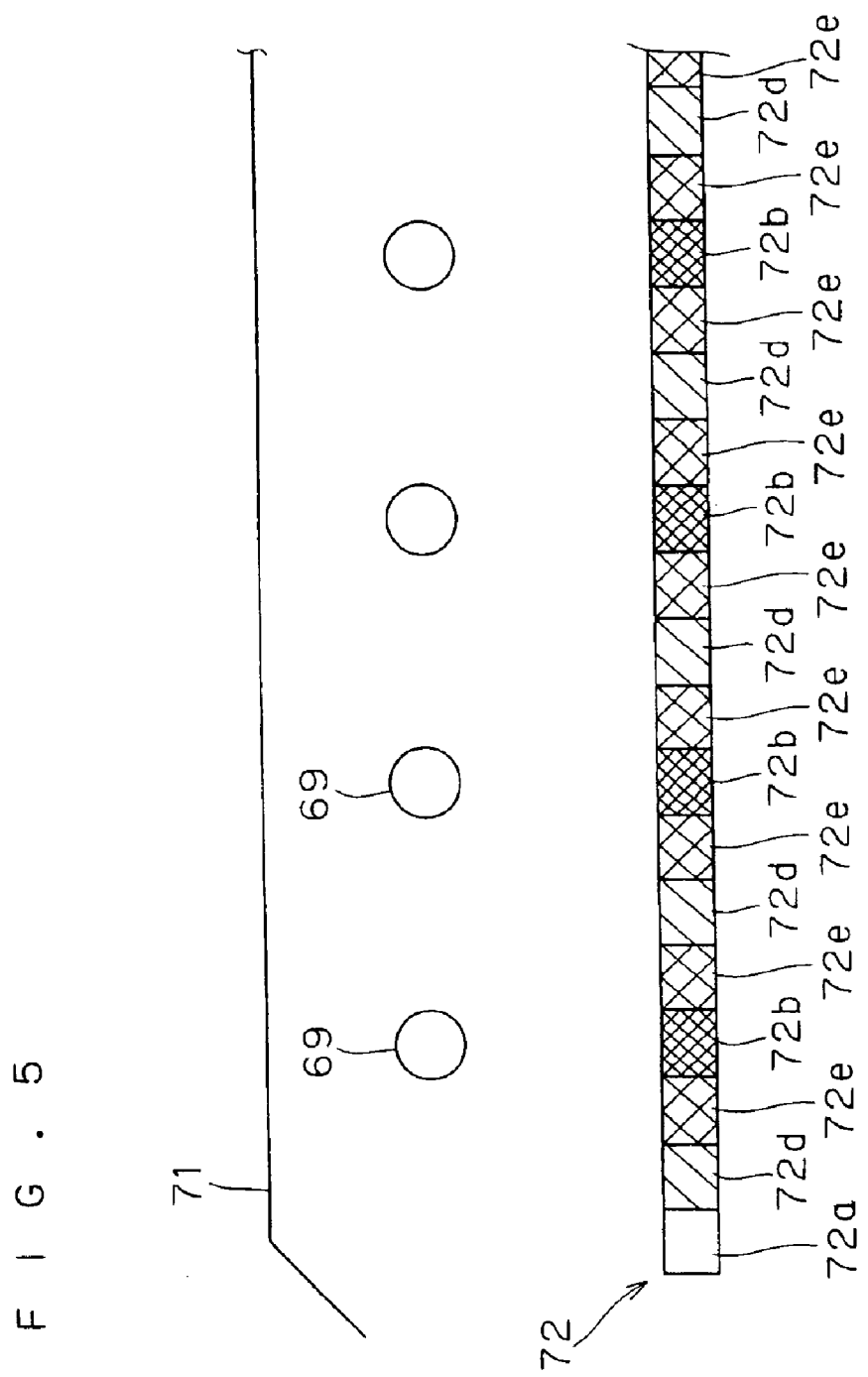

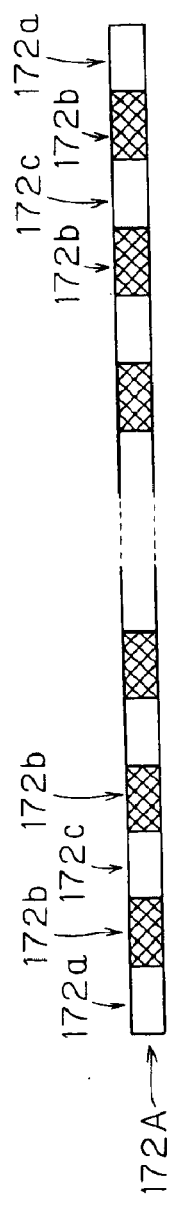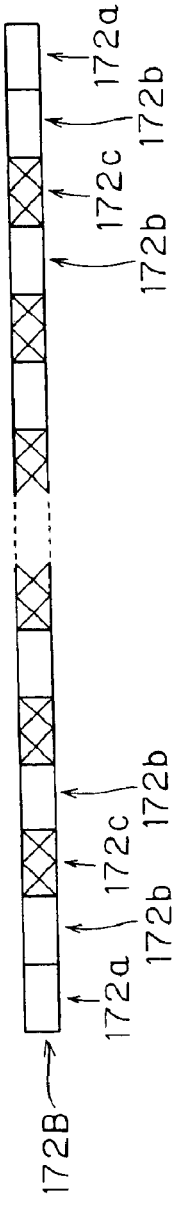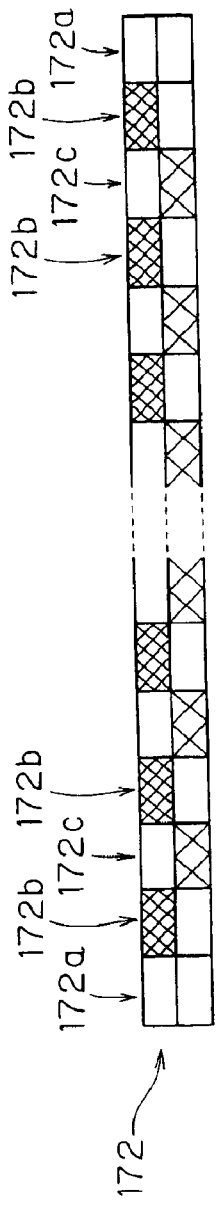

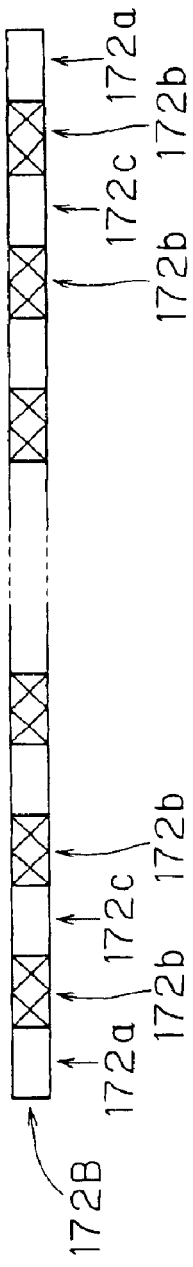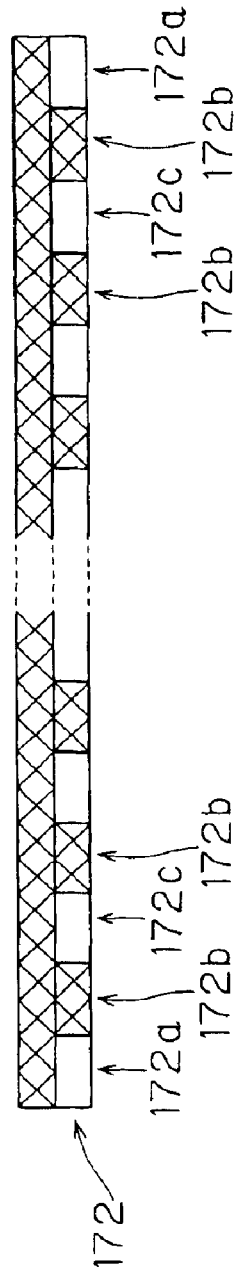

F I G . 8
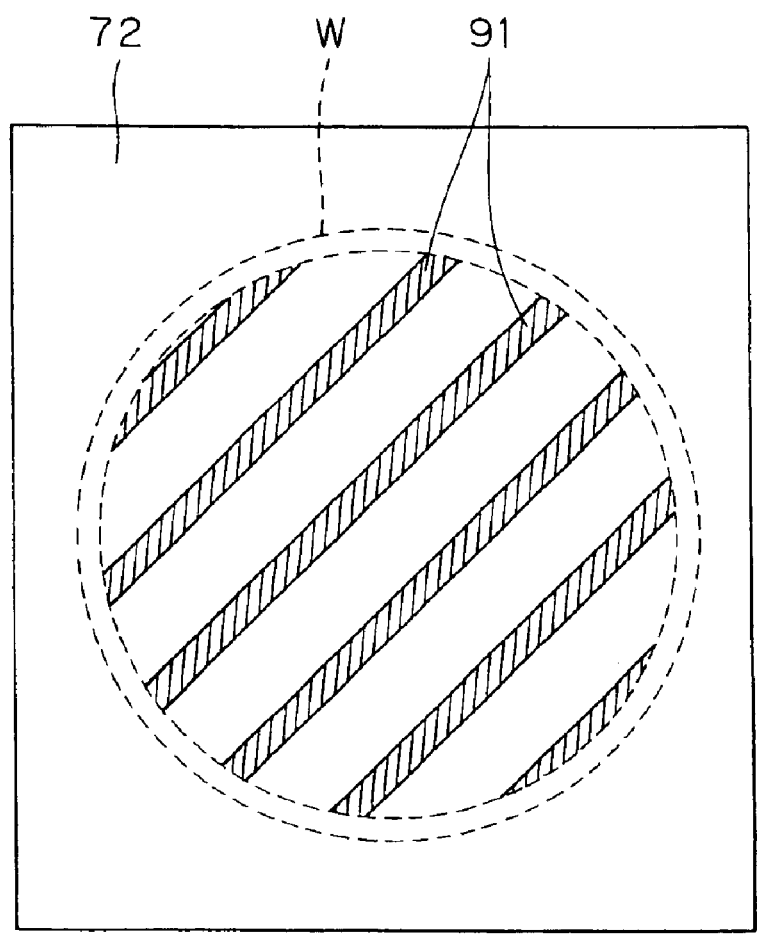

LIGHT IRRADIATION TYPE THERMAL PROCESSING APPARATUS

BACKGROUND OF THE INVENTION

1. Field of the Invention

The present invention relates to a thermal processing apparatus that performs thermal processing of a semiconductor wafer and glass substrate, etc. (hereinafter referred to simply as a "substrate" in some cases) by irradiating flash to the substrate.

2. Description of the Background Art

In an ion activation step of a semiconductor wafer after being subjected to ion implantation, heretofore, there has been employed a thermal processing apparatus such as a lamp annealing apparatus using halogen lamps. In such a thermal processing apparatus, the ion activation of a semiconductor wafer is carried out by heating (annealing) the semiconductor wafer to temperatures of, for example, approximately 1000° C. to 1100° C. This thermal processing apparatus is configured so as to elevate the temperature of the substrate at a speed of about several hundreds of degrees (° C.) per second, by utilizing the energy of light irradiated from the halogen lamps.

Relating to the lamp annealing apparatus using halogen lamps, for example, Japanese Patent Application Laid-Open Nos. 2002-110579 and 2002-110580 have proposed a technique of maintaining temperature uniformity on a wafer with the use of a diffusion plate that is manufactured by grinding the surface of a quartz plate so as to have a rough surface including a large number of irregularities, alternatively, by processing a quartz plate so as to contain a large number of fine pores.

However, even when ion activation of a semiconductor wafer is executed by using the thermal processing apparatus that elevates the temperature of the substrate at a speed of about several hundreds of degrees per second, the profile of ions implanted into the semiconductor wafer becomes gradual. That is, it has been found to cause the phenomenon that ions diffuse by heat. At an occurrence of this phenomenon, even if ions are implanted at high concentration into the semiconductor wafer surface, the implanted ions may diffuse. This introduces the problem that it is necessary to implant more ions than necessary.

In order to solve the above problem, for example, Japanese Patent Application Laid-Open Nos. 59-169125 and 63-166219 have proposed such a technique of elevating only the temperature of the surface of a semiconductor wafer after being subjected to ion implantation in an extremely short period of time (not exceeding several milliseconds) by irradiating flash to the wafer surface with the use of xenon flash lamps, etc. The ions will not have time to diffuse with the temperature elevation in a very short time by the xenon flash lamps. This allows only the execution of ion activation without causing a gradual profile of ions implanted into the wafer.

In the thermal processing apparatus using the above xenon flash lamps, a plurality of xenon flash lamps in the shape of a bar or the like are arranged. Energy necessary for annealing increases remarkably as the distance between these xenon flash lamps and the semiconductor wafer increases. Therefore, from the viewpoint of energy saving, it is unavoidable that the xenon flash lamps are close to the semiconductor wafer to some degree. By doing so, however, part of the wafer surface located immediately below the lamps will have a higher illumination than other parts, thereby losing in-plane uniformity of temperature distribution.

Further, although the region in which the plurality of xenon flash lamps are arranged is considerably larger than the area of the semiconductor wafer, the edge part of the semiconductor wafer has somewhat lower illumination than the inside part thereof.

Although the lamp annealing apparatus using conventional halogen lamps suffers from the same problem, it can employ such a solution that a wafer is rotated to maintain in-plane uniformity of illumination distribution because the time required for elevating the temperature up to a desired temperature is relatively long.

Whereas in the thermal processing apparatus using the xenon flash lamps, since the temperature elevation time by flash irradiation is extremely short, even if a wafer is rotated, it is impossible to maintain in-plane uniformity of illumination distribution. This introduces the problem that in-plain uniformity of temperature distribution on the wafer surface is impaired to cause variations in processing results.

SUMMARY OF THE INVENTION

The present invention is directed to a thermal processing apparatus that heats a substrate by irradiating light to the substrate.

According to the present invention, a thermal processing apparatus includes a light source, a hold element and a diffusion plate. The light source consists of a plurality of lamps arranged in a plane. The hold element holds a substrate at a location below the light source. The diffusion plate is disposed between the light source and a substrate held by the hold element such that they are substantially parallel with one another. The diffusion plate diffuses light emitted from each of the plurality of lamps and directs it to the substrate. In the diffusion plate, the light transmittance of a center corresponding part located in a vertical immediate downward direction of the arrangement of the plurality of lamps is lower than the light transmittance of an end corresponding part located outside the center corresponding part.

This allows for more intense diffusion of the light from the central part in which the lamps are arranged, thereby improving in-plane uniformity of illumination distribution on the substrate.

According to one aspect of the present invention, a thermal processing apparatus includes a light source, a hold element and a diffusion plate. The light source consists of a plurality of lamps arranged in a plane. The hold element holds a substrate at a location below the light source. The diffusion plate is disposed between the light source and a substrate held by the hold element such that they are substantially parallel with one another. The diffusion plate diffuses light emitted from each of the plurality of lamps and directs it to the substrate. In the diffusion plate, the light transmittance of a lamp corresponding part located in a vertical immediate downward direction of each of the plurality of lamps is lower than the light transmittance of an inter-lamp corresponding part located between the lamp corresponding parts adjacent to each other.

The light that is emitted from each of the lamps and directed in a vertical immediate downward direction is diffused intensely, whereas the degree of light diffusion is reduced immediately below space between the adjacent lamps, thereby improving in-plane uniformity of illumination distribution on the substrate.

According to other aspect of the present invention, a thermal processing apparatus includes a light source, a hold element and a diffusion plate. The light source consists of a plurality of flash lamps arranged in a plane. The hold element holds a substrate at a location below the light source. The diffusion plate is disposed between the light source and a substrate held by the hold element such that they are substantially parallel with one another. The diffusion plate diffuses light emitted from each of the plurality of flash lamps and directs it to the substrate.

By the presence of the diffusion plate for diffusing the light emitted from each of the flash lamps and directing it to the substrate, it is possible to improve in-plane uniformity of illumination distribution on a substrate, which is attained by the flash lamps.

Accordingly, it is an object of the present invention to provide a thermal processing apparatus capable of improving in-plane uniformity of illumination distribution on a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side sectional view illustrating the configuration of a thermal processing apparatus according to a first preferred embodiment of the present invention;

FIG. 5 is a diagram to explain a light diffuser according to a second preferred embodiment;

FIGS. 6A and 6B are diagrams to explain a light diffuser according to a third preferred embodiment;

FIGS. 7A and 7B are diagrams to explain a light diffuser according to a fourth preferred embodiment;

FIG. 8 is a plan view illustrating one example of a light diffuser according to a fifth preferred embodiment;

DESCRIPTION OF THE PREFERRED EMBODIMENTS

Preferred embodiments of the present invention will be described in detail by referring to the accompanying drawings.

1. First Preferred Embodiment

Figure 2:
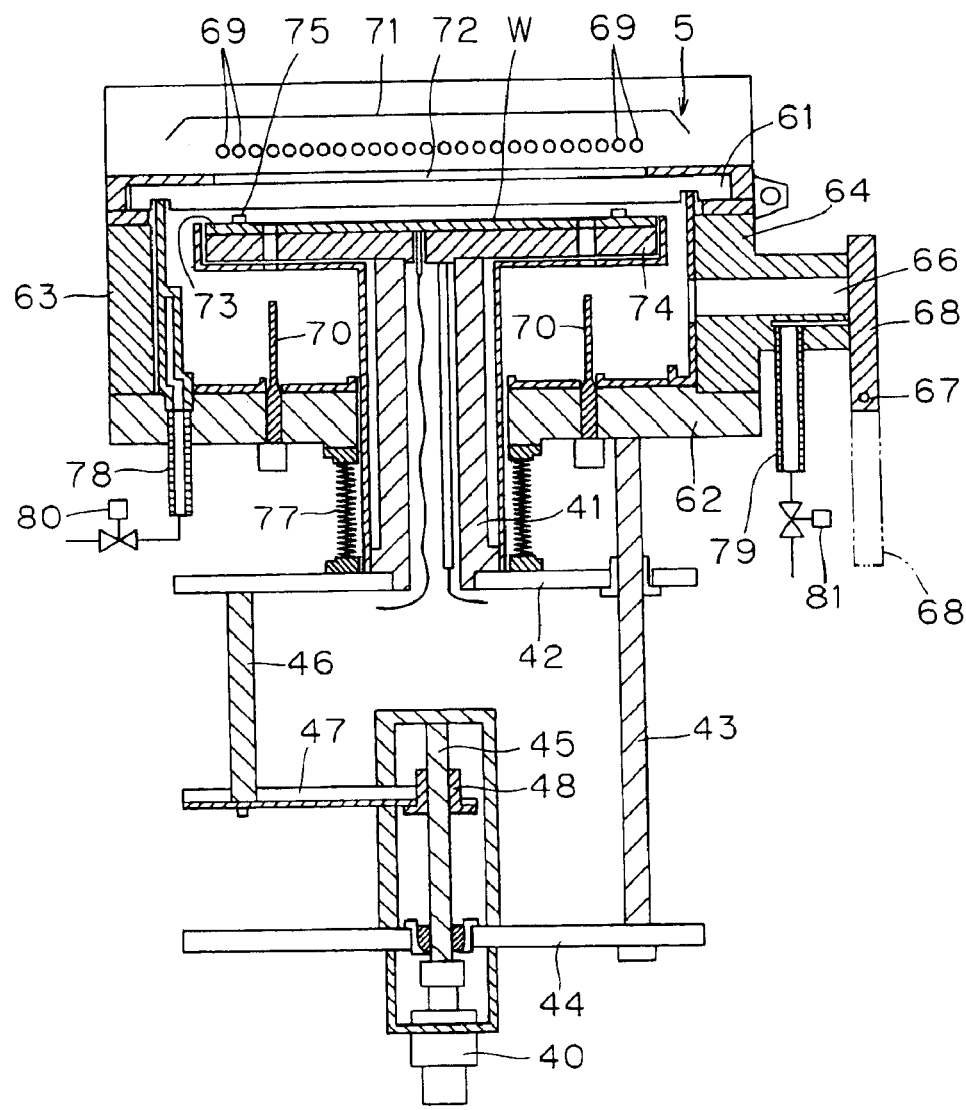
FIG. 2 is other side sectional view illustrating the configuration of the thermal processing apparatus of the first preferred embodiment.

FIGS. 1 and 2 are side sectional views illustrating the configuration of a thermal processing apparatus according to the present invention. This thermal processing apparatus is an apparatus to perform thermal processing of substrates, such as semiconductor wafers, by flash from xenon flash lamps.

This thermal processing apparatus comprises a translucent plate 61, bottom plate 62 and a pair of side plates 63 and 64, and it has in its inside a chamber 65 that houses a semiconductor wafer W and performs its thermal processing. The translucent plate 61 configuring an upper part of the chamber 65 is, for example, composed of an infrared-transparent material such as quartz, and it functions as a chamber window, through which the light emitted from a light source 5 transmits and enters into the chamber 65. The bottom plate 62 configuring the chamber 65 is provided with a support pin 70 that passes through a thermal diffuser 73 and heating plate 74, which will be described later, and also supports the semiconductor wafer W from its lower surface.

The side plate 64 configuring the chamber 65 is provided with an opening part 66 through which the semiconductor wafer W is loaded and unloaded. The opening part 66 can be opened and closed by a gate valve 68 that rotates about an axis 67. The semiconductor wafer W is loaded, with the opening part 66 opened, into the chamber 65 by a transport robot (not shown). When the semiconductor wafer W is subjected to thermal processing in the chamber 65, the gate valve 68 closes the opening part 66.

The chamber 65 is disposed under the light source 5. The light source 5 has a plurality of (specifically, 25 in this preferred embodiment) xenon flash lamps 69 which are hereinafter simply referred to as "flash lamps 69" in some cases, and a reflector 71. The flash lamps 69 are bar-like lamps having a long cylindrical shape and are arranged in a plane and parallel with one another such that their respective longitudinal directions are along a horizontal direction. The reflector 71 is disposed above the flash lamps 69 so as to cover all of them.

Each xenon flash lamp 69 has a glass tube filled with xenon gas, both ends of which are respectively provided with an anode and cathode connected to a condenser, and a trigger electrode that is wound around the peripheral part of the glass tube. Xenon gas is electrically insulator and no current flows in the glass tube in the normal state. However, when a high voltage is applied to the trigger electrode in order to break insulation, the current stored in the condenser flows momentarily in the glass tube, and Joule heat generated at that time heats the xenon gas to emit light. In the xenon flash lamp 69, electrostatic energy previously stored is converted to extremely short optical pulses of 0.1 milliseconds to 10 milliseconds. Therefore, the flash lamp 69 has a characteristic feature that it can irradiate extremely more intense light than a light source of continuous lighting.

A light diffuser 72 is disposed between the light source 5 and translucent plate 61 and diffuses lights emitted from the flash lamps 69. The light diffuser 72 is obtainable by performing light diffusion processing of the surface of a quartz glass that is infrared-transparent material. Its detail will be described hereinafter.

Part of the light emitted from each flash lamp 69 passes directly through the light diffuser 72 and translucent plate 61 into the chamber 65. Other part of the light emitted from the flash lamp 69 is first reflected by the reflector 71 and then passes through the light diffuser 72 and translucent plate 61 into the chamber 65.

The heating plate 74 and thermal diffuser 73 are disposed in the chamber 65. The thermal diffuser 73 is adhered on an upper surface of the heating plate 74. A pin 75 for preventing dislocation of the semiconductor wafer W is provided on the surface of the thermal diffuser 73.

The heating plate 74 is used to preheat (i.e., assist heating) the semiconductor wafer W. The heating plate 74 is made of aluminum nitride and has in its inside a heater and a sensor for controlling the heater. On the other hand, the thermal diffuser 73 is used to preheat uniformly the semiconductor wafer W by diffusing thermal energy from the heating plate 74. As a material of the thermal diffuser 73, there can be used one that has a relatively small thermal conductivity such as sapphire ($Al_2O_3$, aluminum oxide) and quartz, etc.

It is configured such that a motor 40 drives the thermal diffuser 73 and heating plate 74 to move up and down between loading and unloading positions of the semiconductor wafer W that are shown in FIG. 1, and a thermal processing position of the semiconductor wafer W that is shown in FIG. 2.

Specifically, the heating plate 74 is connected via a cylindrical body 41 to a movable plate 42. A guide member 43 suspended from the bottom plate 62 of the chamber 65 guides the movable plate 42 so that it can move up and down. A stationary plate 44 is fixed to a lower end part of the guide member 43, and the motor 40 that drives a ball screw 45 to rotate is disposed at a central part of the stationary plate 44. The ball screw 45 is screwed on a nut 48 that is connected via connecting members 46 and 47 to the movable plate 42. Thus, by the driving of the motor 40, the thermal diffuser 73 and heating plate 74 can move up and down between the loading and unloading positions and the thermal processing position.

The loading and unloading positions of the semiconductor wafer W shown in FIG. 1 correspond to a position obtained when the thermal diffuser 73 and heating plate 74 are lowered in order that the semiconductor wafer W to be loaded through the opening part 66 by the transport robot (not shown) is mounted on the support pin 70 and the semiconductor wafer W mounted on the support pin 70 is unloaded through the opening part 66. In this state, the upper end of the support pin 70 passes through each though hole formed in the thermal diffuser 73 and heating plate 74, and then projects beyond the surface of the thermal diffuser 73.

On the other hand, the thermal processing position of the semiconductor wafer W shown in FIG. 2 corresponds to a position obtained when the thermal diffuser 73 and heating plate 74 are raised above the upper end of the support pin 70 in order to perform thermal processing of the semiconductor wafer W. In the process that the thermal diffuser 73 and heating plate 74 move up from the loading and unloading positions in FIG. 1 to the thermal processing position in FIG. 2, the semiconductor wafer W mounted on the support pin 70 is received by the thermal diffuser 73, and raised with its lower surface supported by the surface of the thermal diffuser 73, and then held in a horizontal position at a location close to the translucent plate 61 in the chamber 65. In contrast, in the process that the thermal diffuser 73 and heating plate 74 move down from the thermal processing position to the loading and unloading positions, the semiconductor wafer W supported by the thermal diffuser 73 is delivered to the support pin 70.

When the thermal diffuser 73 and the heating plate 74 that hold the semiconductor wafer W are in the thermal processing position, the translucent plate 61 is located between the semiconductor wafer W held by them and the light source 5. Note that the distance between the thermal diffuser 73 and light source 5 at that time is adjustable to any value by controlling the amount of rotation of the motor 40.

Between the bottom plate 62 of the chamber 65 and the movable plate 42, there is disposed an extensible bellows 77 that surrounds the periphery of the cylindrical body 41 so as to maintain the chamber 65 in an airtight state. The bellows 77 shrinks when the thermal diffuser 73 and heating plate 74 have been raised to the thermal processing position, and it extends when they have been lowered to the loading and unloading positions, thereby separating the atmosphere of the chamber 65 from the external atmosphere.

An introduction path 78 connected in communication to a switching valve 80 is formed in a side plate 63 that is disposed the opposite side of the opening part 66 in the chamber 65. Through the introduction path 78, gas required for processing such as inactive nitrogen gas is introduced into the chamber 65. A discharge path 79 connected in communication to a switching valve 81 is formed in the opening part 66 of the side plate 64. The discharge path 79 is used to discharge the gas in the chamber 65 and connected via the switching valve 81 to a discharge means (not shown).

In the thermal processing apparatus so configured, the light diffuser 72 is a plate-like member that is located parallel to the arrangement of the flash lamps 69 as the light source 5, and to the semiconductor wafer W held at the thermal processing position by the thermal diffuser 73 and heating plate 74 in the chamber 65. The flash lamps 69 are arranged along a horizontal plane, and the semiconductor wafer W is held in the horizontal position by the thermal diffuser 73, so that the light diffuser 72 is also disposed along the horizontal plane.

Figure 3:
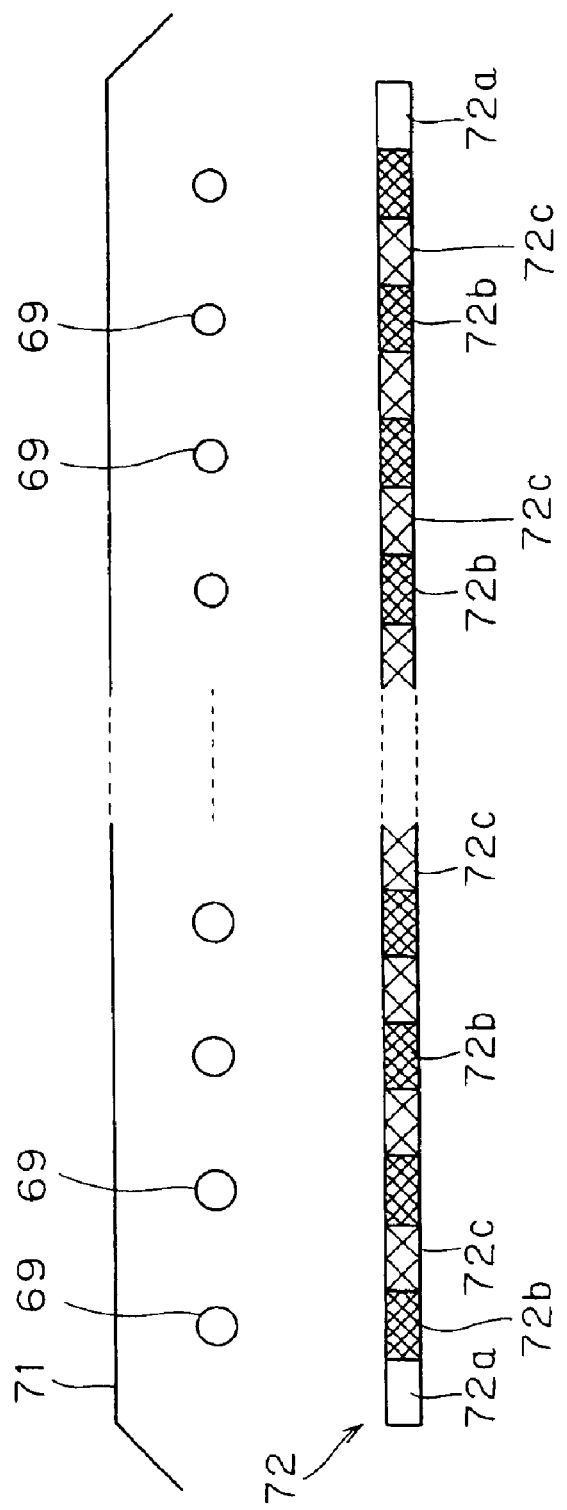
FIG. 3 is a diagram to explain a light diffuser of the first preferred embodiment.

FIG. 3 is a diagram to explain the light diffuser 72 of the first preferred embodiment. As described above, the light diffuser 72 is obtained by performing light diffusion processing of the surface of a quartz glass that is infrared-transparent material. Quartz is a desirable material for the light diffuser 72 because it has heat resistance, high strength and small optical attenuation factor. Synthetic quartz is more suitable than fusion quartz because the former causes less optical attenuation of ultraviolet region light that contributes to flash heating.

Referring to FIG. 3, the light diffuser 72 of the first preferred embodiment is subjected to a variety of light diffusion processing. That is, no light diffusion processing is performed to an end corresponding part 72a of the light diffuser 72 that is located outside space in a vertical immediate downward direction of the arrangement of the flash lamps 69. On the other hand, a strong light diffusion processing and a weak light diffusion processing are performed alternately so as to form a stripe pattern with respect to a center corresponding part of the light diffuser 72 that is located at space in a vertical immediate downward direction of the arrangement of the flash lamps 69 (i.e., parts other than the end corresponding part 72a). More specifically, the strong light diffusion processing is performed to a lamp corresponding part 72b that is located in a vertical immediate downward direction of each of the flash lamps 69. The weak light diffusion processing is performed to an inter-lamp corresponding part 72c located between the lamp corresponding parts 72b adjacent to each other.

As a concrete method of the above-mentioned light diffusion processing, there can be employed, for example, a combination of masking process and blasting method. According to this combined method, firstly, a photoresist (sensitive material) is applied to the entire surface of a light diffuser 72 to which no light diffusion processing is performed, followed by exposure processing and development processing of a mask pattern, so that only the inter-lamp corresponding part 72c is exposed and the rest is covered with the photoresist. In this mask state, a surface processing is performed with blasting method such as sandblasting, so that only the inter-lamp corresponding part 72c is subjected to light diffusion processing. In the sandblast processing of the inter-lamp corresponding part 72c, abrasive having a relatively large particle size is used to obtain the weak light diffusion processing.

Subsequently, after the above-mentioned photoresist is totally removed, a photoresist is again applied to the entire surface of the light diffuser 72, followed by exposure processing and development processing of a mask pattern different from the above, so that only the lamp corresponding part 72b is exposed and the rest is covered with the photoresist. Then, in this mask state, a surface processing is performed again with blasting method such as sandblasting, so that only the lamp corresponding part 72b is subjected to light diffusion processing. In the sandblast processing of the lamp corresponding part 72b, abrasive that has a smaller particle size than that in the inter-lamp corresponding part 72c is used to obtain the strong light diffusion processing. This results in the light diffuser 72 as shown in FIG. 3.

Through the foregoing light diffusion processing, the light transmittance of light in the lamp corresponding part 72b subjected to the strong light diffusion processing (strictly speaking, the transmittance of light emitted from the flash lamps 69) is lower than the light transmittance of the inter-lamp corresponding part 72c subjected to the weak light diffusion processing. Further, the light transmittance of the end corresponding part 72a not subjected to any light diffusion processing is higher than that of the center corresponding part (i.e., the lamp corresponding part 72b and inter-lamp corresponding part 72c). That is, the light transmittance of the both ends of the light diffuser 72 is the highest. Between the end parts, a high transmittance part and a low transmittance part alternate with each other to form a stripe pattern.

The following is a thermal processing operation of a semiconductor wafer W in the thermal processing apparatus so configured. The semiconductor wafer W that is a processing object of the thermal processing apparatus is a semiconductor wafer after being subjected to ion implantation.

In this thermal processing apparatus, in the state that the thermal diffuser 73 and heating plate 74 are in the loading and unloading positions of the semiconductor wafer W shown in FIG. 1, the semiconductor wafer W is loaded through the opening part 66 by the transport robot (not shown) and then mounted on the support pin 70. At the completion of the loading of the semiconductor wafer W, the gate valve 68 closes the opening part 66. Thereafter, the motor 40 drives the thermal diffuser 73 and heating plate 74 to move up to the thermal processing position of the semiconductor wafer W shown in FIG. 2, and then holds it in a horizontal position. Also, the switching valves 80 and 81 are opened to form a gas stream of nitrogen gas in the chamber 65.

The thermal diffuser 73 and heating plate 74 are preheated to a predetermined temperature by the action of the heater contained in the heating plate 74. Therefore, when the thermal diffuser 73 and heating plate 74 are in the thermal processing position of the semiconductor wafer W, the semiconductor wafer W is preheated by making contact with the thermal diffuser 73 in its preheated state, so that the temperature of the semiconductor wafer W increases gradually.

In this state, the semiconductor wafer W is continuously heated by the thermal diffuser 73. During the time that the temperature of the semiconductor wafer W is increasing, a temperature sensor (not shown) always monitors whether the surface temperature of the semiconductor wafer W reaches a preheating temperature T1 or not.

The preheating temperature T1 is, for example, about 200° C. to about 600° C., preferably about 350° C. to about 550° C. Even when the semiconductor wafer W is heated to the preheating temperature T1 in this temperature range, the ions implanted into the semiconductor wafer W do not diffuse.

Then, when the surface temperature of the semiconductor wafer W reaches the preheating temperature T1, the flash lamps 69 light up to perform flash heating. The lighting time of the flash lamps 69 in the flash heating step is about 0.1 milliseconds to about 10 milliseconds. Thus, extremely intense flash can be irradiated from the flash lamps 69 because the static energy previously stored is converted to such short optical pulses.

The surface temperature of the semiconductor wafer W momentarily reaches temperature T2 by the flash heating. Temperature T2 is about 1000° C. to about 1100° C., which is required for ion activation processing of the semiconductor wafer W. Elevating the temperature of the surface of the semiconductor wafer W to the processing temperature T2 can activate the ions implanted into the semiconductor wafer W.

In this case, the surface temperature of the semiconductor wafer W is elevated to the processing temperature T2 in an extremely short time of about 0.1 milliseconds to about 10 milliseconds, thereby completing the activation of the ions in the semiconductor wafer W in a short period of time. Therefore, the ions implanted into the semiconductor wafer W do not diffuse, and it is possible to avoid the phenomenon that the profile of the ions implanted into the semiconductor wafer W becomes gradual. Note that since the time required for ion activation is extremely shorter than the time required for ion diffusion, the ion activation is completed even in such a short period of time, about 0.1 milliseconds to about 10 milliseconds, which is too short to cause diffusion.

Before the flash lamps 69 light up to heat the semiconductor wafer W, the surface temperature of the semiconductor wafer W is already heated to the preheating temperature T1 of about 200° C. to about 600° C., with the use of the heating plate 74. It is therefore possible to quickly elevate the semiconductor wafer W to the processing temperature T2 of about 1000° C. to about 1100° C., with the use of the flash lamps 69.

After the flash heating step is terminated, the motor 40 drives the thermal diffuser 73 and heating plate 74 to move down to the loading and unloading positions of the semiconductor wafer W shown in FIG. 1, and the opening part 66 that has been closed by the gate valve 68 is opened. Then, the transport robot (not shown) unloads the semiconductor wafer W mounted on the support pin 70. Thus, a sequence of the heat processing operation is completed.

Figure 4:
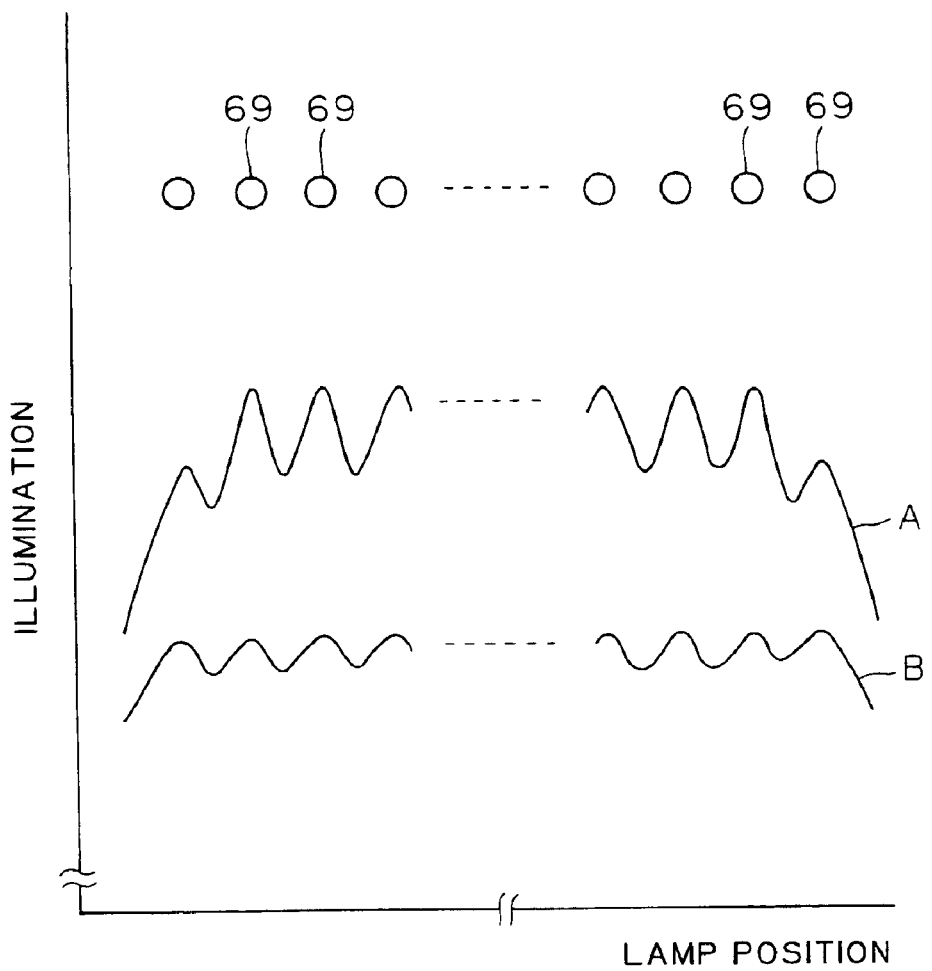
FIG. 4 is a schematic diagram showing the relationship between the illumination of lights irradiated from flash lamps on a semiconductor wafer surface in the absence of a light diffuser and the position in the direction of arrangement of the flash lamps.

Although the thermal processing apparatus of the first preferred embodiment includes the light diffuser 72 that has different types of transmittance regions, it is now proposed to consider the case of executing flash heating in the absence of the light diffuser 72. This will cause great variations in illumination distribution on the semiconductor wafer W. FIG. 4 shows schematically the relationship between the illumination of light emitted from the flash lamps 69 to the surface of the semiconductor wafer W, and the position of the direction of arrangement of the flash lamps. In FIG. 4, alphabetic character "A" represents the illumination distribution on the semiconductor wafer W in the absence of the light diffuser 72. As indicated by "A", nonuniformity of illumination distribution increases when the semiconductor wafer W in the thermal processing position is close to the light source 5 to some degree in the absence of the light diffuser 72.

In contrast, when the flash heating is performed in the presence of the light diffuser 72, as in the thermal processing apparatus of the first preferred embodiment, the light emitted from each of the flash lamps 69 is diffused and directed to the semiconductor wafer W in the thermal processing position, thereby relaxing nonuniformity of illumination distribution on the semiconductor wafer W.

In the light diffuser 72 of the first preferred embodiment, since the end corresponding part 72*a* has a higher light transmittance than the center corresponding part, the light from the central part in which the flash lamps 69 are arranged is diffused more intensely, so that in-plane uniformity of illumination distribution on the semiconductor wafer W is further improved.

In addition, since the light transmittance of the lamp corresponding part 72*b* is lower than that of the inter-lamp corresponding part 72*c*, the light emitted from each of the flash lamps 69 in a vertical immediate downward direction is diffused intensely, whereas the degree of light diffusion is reduced at a location immediately below space between the adjacent flash lamps 69. As the result, the in-plane uniformity of illumination distribution on the semiconductor wafer W is further improved.

Thus, flash heating executed in the thermal processing apparatus with the light diffuser 72 of FIG. 3 produces such an illumination distribution on the semiconductor wafer W as represented by alphabetic character "B" in FIG. 4, which shows an improved in-plane uniformity of illumination distribution on the semiconductor wafer W, as compared to that represented by alphabetic character "A."

2. Second Preferred Embodiment

The following is a second preferred embodiment of the present invention. Except for the configuration of a light diffuser 72, a thermal processing apparatus of the second preferred embodiment has the same configuration and operation as the thermal processing apparatus of the first preferred embodiment, and their details are omitted here.

FIG. 5 is a diagram to explain the light diffuser 72 of the second preferred embodiment. The light diffuser 72 has the same arrangement and material as the first preferred embodiment, except for the type of regions to be subjected to light diffusion processing.

Referring to FIG. 5, a variety of light diffusion processing are performed to the light diffuser 72 of this embodiment. That is, no light diffusion processing is performed to an end corresponding part 72*a* of the light diffuser 72 that is located outside space in a vertical immediate downward direction of the arrangement of a plurality of flash lamps 69. Three-step light diffusion processing is repeated so as to form a stripe pattern with respect to a center corresponding part of the light diffuser 72 that is located inside the end corresponding part 72*a* (i.e., parts other than the end corresponding part 72*a*). Specifically, the strongest light diffusion processing is performed to a lamp corresponding part 72*b* that is located in a vertical immediate downward direction of each of the flash lamps 69. The weakest light diffusion processing is performed to an inter-lamp center corresponding part 72*d* that is located in the vicinity of the center between lamp corresponding parts 72*b* adjacent to each other. The medium light diffusion processing is performed to a transition region part 72*e* between the lamp corresponding part 72*b* and inter-lamp center corresponding part 72*d*.

As a concrete method of the above-mentioned light diffusion processing, there can be employed, for example, a combination of masking process and blasting method, as in the first preferred embodiment. Three types of mask patterns are successively formed, and abrasives having different particle sizes are each separately used in three steps. This results in the light diffuser 72 as shown in FIG. 5.

Here, a portion in direct contact with the inside of the end corresponding part 72*a* is handled as an inter-lamp center corresponding part 72*d*, and the space between the inter-lamp center corresponding part 72*d* and a lamp corresponding part 72*b* located in a vertical immediate downward direction of the endmost flash lamp 69 is handed as a transition region part 72*e*.

As the result of the foregoing light diffusion processing, the light transmittance increases gradually from the central position of the lamp corresponding part 72*b* to the inter-lamp center corresponding part 72*d* (i.e., the central position of the inter-lamp corresponding part). Also, the light transmittance decreases gradually from the end corresponding part 72*a* to the lamp corresponding part 72*b* that is the most adjacent to the part 72*a* (i.e., to the center corresponding part). Specifically, the both end parts of the light diffuser 72 have the highest light transmittance, and the location in a vertical immediate downward direction of each of the flash lamps 69 has the lowest light transmittance, and light transmittance changes gradually therebetween.

This configuration also provides the same effect as the first preferred embodiment, and permits a finer adjustment of the degree of light diffusion, thereby further improving the in-plane uniformity of illumination distribution on the semiconductor wafer W.

3. Third Preferred Embodiment

The following is a third preferred embodiment of the present invention. Except for the configuration of a light diffuser 172, a thermal processing apparatus of the third preferred embodiment has the same configuration and operation as the thermal processing apparatus of the first preferred embodiment, and their details are omitted here.

FIGS. 6A and 6B are diagrams to explain the light diffuser 172 of the third preferred embodiment. The light diffuser 172 has the same arrangement and material as the first preferred embodiment, except that it is obtained by laminating two light diffusers 172A and 172B.

Referring to FIG. 6A, no light diffusion processing is performed to an end corresponding part 172*a* of the light diffuser 172A which is located outside space in a vertical immediate downward direction of the arrangement of a plurality of flash lamps 69. A strong light diffusion processing is performed to a lamp corresponding part 172*b* that is located in a vertical immediate downward direction of each of the flash lamps 69. No light diffusion processing is performed to an inter-lamp corresponding part 172*c* between lamp corresponding parts 172*b* adjacent to each other.

On the other hand, no light diffusion processing is performed to an end corresponding part 172*a* of the light diffuser 172B that is located outside space in a vertical immediate downward direction of the arrangement of the flash lamps 69. No light diffusion processing is also performed to a lamp corresponding part 172*b* that is located in a vertical immediate downward direction of each of the flash lamps 69. A weak light diffusion processing is performed to an inter-lamp corresponding part 172*c* between lamp corresponding parts 172*b* adjacent to each other.

As a concrete method of the above-mentioned light diffusion processing, there can be employed, for example, a combination of masking process and blasting method, as in the first preferred embodiment. In the third preferred embodiment, the light diffusers 172A and 172B can be manufactured easily only by forming a single type of mask pattern, respectively.

The light diffuser 172 shown in FIG. 6B is obtainable by laminating the two light diffusers 172A and 172B. The light diffuser 172 is located parallel to the arrangement of the flash lamps 69 and to the semiconductor wafer W held at the thermal processing position, as in the first preferred embodiment.

In the light diffuser 172 so configured, the light transmittance of the lamp corresponding part 172b subjected to the strong light diffusion processing is lower than that of the inter-lamp corresponding part 172c subjected to the weak light diffusion processing. The light transmittance of the end corresponding part 172a not subjected to any light diffusion processing is higher than that of the center corresponding part. That is, like the light diffuser 72 of the first preferred embodiment, the both end parts of the light diffuser 172 have the highest light transmittance, and a high transmittance part and a low transmittance part alternate with each other between these end parts so as to form a stripe pattern.

This configuration also provides the same effect as the first preferred embodiment, and it is relatively easy to manufacture the light diffusers 172A and 172B. In an alternative, there may be prepared a plurality of light diffusers that can be manufactured with a single mask pattern, such as the light diffusers 172A and 172B. A combination of these facilitates manufacture of a light diffuser having a desired transmittance pattern.

4. Fourth Preferred Embodiment

The following is a fourth preferred embodiment of the present invention. Except for the configuration of a light diffuser 172, a thermal processing apparatus of the fourth preferred embodiment has the same configuration and operation as the thermal processing apparatus of the first preferred embodiment, and their details are omitted here.

FIGS. 7A and 7B are diagrams to explain the light diffuser 172 of the fourth preferred embodiment. The light diffuser 172 has the same arrangement and material as the light diffuser 72 of the first preferred embodiment, except that it is obtained by laminating two light diffusers 172A and 172B, as in the third preferred embodiment.

Referring to FIG. 7A, a weak light diffusion processing is performed to the entire surface of a light diffuser 172A. No light diffusion processing is performed to an end corresponding part 172a of the light diffuser 172B that is located outside space in a vertical immediate downward direction of the arrangement of a plurality of flash lamps 69. A weak light diffusion processing is performed to a lamp corresponding part 172b that is located in a vertical immediate downward direction of each of the flash lamps 69. No light diffusion processing is performed to an inter-lamp corresponding part 172c between lamp corresponding parts 172b adjacent to each other.

As a concrete method of the above-mentioned light diffusion processing, there can be employed, for example, a combination of masking process and blasting method, as in the first preferred embodiment. In the fourth preferred embodiment, no mask pattern is required for the light diffuser 172A, and the light diffuser 172B can be manufactured easily only by forming a single mask pattern.

The light diffuser 172 shown in FIG. 7B is obtainable by laminating the two light diffusers 172A and 172B. The light diffuser 172 is located parallel to the arrangement of the flash lamps 69 and to the semiconductor wafer W held at the thermal processing position, as in the first preferred embodiment.

In the light diffuser 172 so configured, the light transmittance of the lamp corresponding part 172b at which the regions subjected to the light diffusion processing are overlapped with each other is lower than that of the inter-lamp corresponding part 172c. The light transmittance of the end corresponding part 172a is higher than that of the lamp corresponding part 172b.

This configuration also provides the same effect as the first preferred embodiment, and it is relatively easy to manufacture the light diffusers 172A and 172B. In an alternative, various types of light diffusers may be combined properly to facilitate manufacture of a light diffuser having a desired transmittance pattern, as in the third preferred embodiment.

5. Fifth Preferred Embodiment

The following is a fifth preferred embodiment of the present invention. Except for the configuration of a light diffuser 72, a thermal processing apparatus of the fifth preferred embodiment has the same configuration and operation as the thermal processing apparatus of the first preferred embodiment, and their details are omitted here.

FIG. 8 is a plan view illustrating one example of the light diffuser 72 of the fifth preferred embodiment. In the fifth preferred embodiment, the light diffuser 72 is a quartz glass plate in which such a geometrical pattern in a ground glass state is formed in a region that is located above parts other than an edge part of a semiconductor wafer W held by a thermal diffuser 73 and heating plate 74 (hereinafter referred to as an "inside part"). In the example of FIG. 8, a stripe pattern 91 in a ground glass state is formed as a geometrical pattern.

As a method of forming the stripe pattern 91, there can be employed a combination of masking process and blasting method, as in the first preferred embodiment. That is, the light diffuser 72 of FIG. 8 is obtainable by forming a mask pattern of a stripe pattern, followed by blasting method with abrasive having a particle size of #400 or #600. According to standard particle size criterion, the particle size of #400 indicates that a particle diameter of 50% points in cumulative height is 34.0±2.0 $\mu$m, and the particle size of #600 indicates that a particle diameter of 50% points in cumulative height is 24.0±1.5 $\mu$m.

In the fifth preferred embodiment, the stripe pattern 91 in a ground glass state is formed in a region of the surface of the light diffuser 72 which is located immediately above the inside part of the semiconductor wafer W held by the thermal diffuser 73 and heating plate 74. No light diffusion processing is performed to a region in which there is no stripe pattern 91.

As described previously, there is a tendency that the illumination at the edge part of the semiconductor wafer W is somewhat reduced than that of the inside part. With the use of the light diffuser 72 of FIG. 8, the illumination of the inside part of the semiconductor wafer W during the time of flash heating is reduced depending on the ratio of the area of the stripe pattern 91 in a region located above the inside part of the semiconductor wafer W to the area of the rest in the same region. That is, the illumination of the inside part of the semiconductor wafer W during the time of flash heating decreases greatly with increasing the area of the stripe pattern 91 in the region located above the inside part of the semiconductor wafer W.

Therefore, the illumination distribution of the entire surface of the semiconductor wafer W during the flash heating can be made uniform by forming the stripe pattern 91 in an area ratio at which the illumination of the inside part of the semiconductor wafer W is nearly as low as that of the edge part.

Meanwhile, it is theoretically possible to make the inside part of the semiconductor wafer W have approximately the same illumination as the edge part by performing a weak ground glass processing (light diffusion processing) to the entire region located above the inside part of the semiconductor wafer W. However, such a weak ground glass processing is low in industrial repeatability and unpractical. On the other hand, a strong ground glass processing with abrasive having a particle size of #400 or #600, as in the fifth preferred embodiment, is industrially stable, and the ground glass state having the same surface roughness is realized at high repeatability. According to the fifth preferred embodiment, the illumination of the inside part of the semiconductor wafer W during flash heating is adjusted precisely by adjusting, in an industrially stable manner, the ratio of the area of the stripe pattern 91 in a region located above the inside part of the semiconductor wafer W to the area of the rest in the same region. The ground glass processing with abrasive of a particle size of #400 provides about 1.16 $\mu$m in mean surface roughness (Ra). The ground glass processing with abrasive of a particle size of #600 provides about 0.36 $\mu$m in mean surface roughness (Ra).

In the case that the stripe pattern 91 is directly projected on the semiconductor wafer W, the uniformity of illumination distribution might be impaired. The fifth preferred embodiment prevents the stripe pattern 91 being directly projected on the semiconductor wafer W by making the pitch of the stripe pattern 91 smaller than the arrangement pitch of the flash lamps 69.

6. Modifications

It should be noted that the present invention is not limited to the foregoing preferred embodiments. Although in these embodiments, 25 flash lamps 69 are employed as the light source 5, the number of flash lamps 69 may be determined at will.

The light diffuser 72 may be disposed at any position between the light source 5 and the semiconductor wafer W held at the thermal processing position.

The light diffuser 72 may be manufactured by processing a quartz glass so as to contain a large number of fine pores, without limiting to a combination of masking process and blasting method. Alternatively, air blasting etc. may be used as blasting method. However, the use of masking process permits more reliable manufacture of a plurality of regions having different transmittances, as in the light diffusers of the foregoing preferred embodiments.

The technique of the present invention is also applicable to a thermal processing apparatus in which instead of the flash lamps 69, other type of lamps (e.g., halogen lamps) are provided as the light source 5, and a semiconductor wafer W is heated by light irradiation from the lamps. Also in this case, the light emitted from each of the lamps and directed to a vertical immediate downward direction is diffused intensely, while reducing the degree of light diffusion in immediately below space between the adjacent lamps, so that in-place uniformity of illumination distribution on the semiconductor wafer W is further improved.

In the first to fourth preferred embodiments, a plurality of regions that have different transmittances are formed in the light diffuser 72. In an alternative, light diffusion processing may be performed such that the entire surface of the light diffuser 72 has a uniform transmittance. Even with this light diffuser 72, it is possible to diffuse the light that is emitted from each of the lamps and then directed in a vertical immediate downward direction. Therefore, the in-plane uniformity of illumination distribution on the semiconductor wafer W can be improved than may be the case of having no light diffuser 72. Especially, when employing flash lamps as the light source 5, it is impossible to maintain in-plane uniformity of illumination distribution by the rotation of the wafer, as previously described. It is therefore significant to improve in-plane uniformity of illumination distribution by the light diffuser 72.

Figure 9:
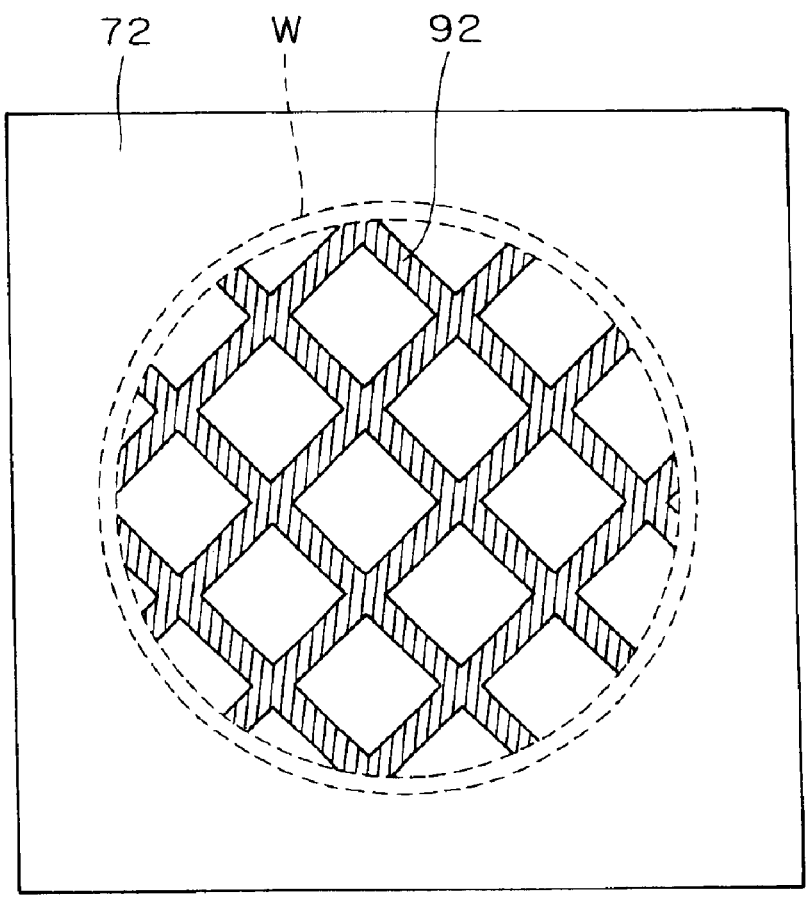
FIG. 9 is a plan view illustrating other example of the light diffuser of the fifth preferred embodiment.
Figure 10:
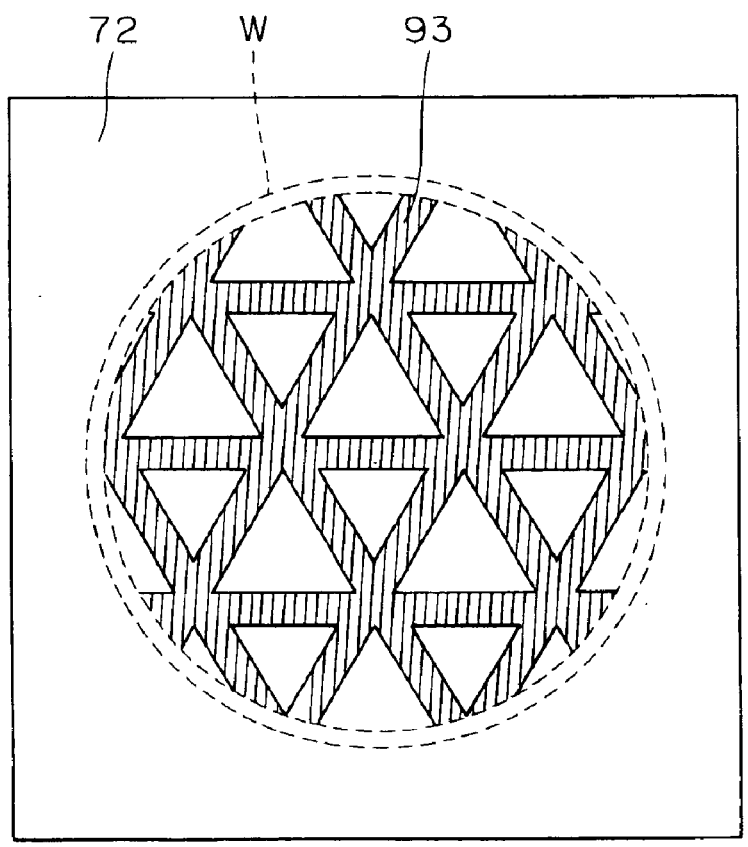
FIG. 10 is a plan view illustrating still other example of the light diffuser of the fifth preferred embodiment.

The light diffuser 72 as shown in FIG. 9 or FIG. 10 may be used in the fifth preferred embodiment. In the example of FIG. 9, a parallel crosses pattern 92 in a ground glass state is formed in a region that is located above the inside part of a semiconductor wafer W held by the thermal diffuser 73 and heating plate 74. In the example of FIG. 10, a woven bamboo pattern 93 in a ground glass state is formed in a region that is located above the inside part of a semiconductor wafer W held by the thermal diffuser 73 and heating plate 74. These patterns may be formed in the same manner as in the fifth preferred embodiment.

Even with this configuration, the illumination distribution on the semiconductor wafer W during flash heating can be made uniform by forming the parallel crosses pattern 92 or woven bamboo pattern 93 in an area ratio at which the illumination of the inside part of the semiconductor wafer W is nearly as low as that of the edge part. Further, adjustment of the area ratio of the parallel crosses pattern 92 or woven bamboo pattern 93 is accomplished in an industrially stable manner. That is, by forming a geometrical pattern of a ground glass state in a region that is located above the inside part of the semiconductor wafer W held by the thermal diffuser 73 and heating plate 74, and then adjusting the ratio of the area of the geometrical pattern in the same region to the area in which there is no geometrical pattern, the illumination of the inside part of the semiconductor wafer W becomes nearly as low as that of the edge part in order to make uniform the illumination distribution on the semiconductor wafer W during flash heating.

In an alternative, a geometrical pattern in a ground glass state may be formed on the entire surface of the light diffuser 72, without limiting to above the inside part of the semiconductor wafer W. Even with this configuration, it is possible to diffuse light that is emitted from each of the lamps and directed in a vertical immediate downward direction. Therefore, the in-plane uniformity of illumination distribution on the semiconductor wafer W can be improved than may be the case of having no light diffuser 72. Especially, when employing flash lamps as the light source 5, for the same reason as described above, it is significant to improve in-plane uniformity of illumination distribution by the light diffuser 72.

In each of the preferred embodiments, the heating plate 74 is used as assist heating means. In an alternative, a plurality of lamps (e.g., a plurality of halogen lamps) may be disposed below a means for holding a semiconductor wafer W, in order to perform assist heating by light irradiation from the lamps. In this case, the in-plane uniformity of illumination distribution on the semiconductor wafer W during assist heating can be further improved by disposing such a light diffuser as described in the respective preferred embodiments between the lamp group for assist heating and the semiconductor wafer W.

Although ion activation is performed by irradiating light to a semiconductor wafer in each of the preferred embodiments, a substrate to be processed by the thermal processing apparatus of the present invention is not limited to a semiconductor wafer. For example, the thermal processing apparatus of the present invention may be used to process a glass substrate in which a variety of silicon films such as a silicon nitride film and polycrystal silicon film are formed. As an example, ion implantation of silicon is performed to a polycrystal silicon film that is formed on a glass substrate by CVD method, so that an amorphous silicon film that is made into amorphous is formed, and a silicon oxide film serving as an antireflection film is formed on the amorphous silicon film. In this state, the thermal processing apparatus of the present invention may perform light irradiation to the entire surface of the amorphous silicon film, thereby forming a polycrystal silicon film that is obtained by polycrystallizing the amorphous silicon film.

Alternatively, to a TFT substrate that is obtained by forming on a glass substrate an underlayer oxide silicon film and a polysilicon film obtained by crystallizing amorphous silicon, and then doping impurities such as phosphor or boron into the polysilicon film, the thermal processing apparatus of the present invention may perform light irradiation in order to activate the impurities implanted in the doping step.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus to heat a substrate by irradiating light to said substrate, comprising:
    a light source consisting of a plurality of lamps arranged in a plane;
    a hold element to hold a substrate at a location below said light source; and
    a diffusion plate that is disposed between said light source and a substrate held by said hold element such that they are substantially parallel with one another, said diffusion plate diffusing light emitted from each of said plurality of lamps and directing it to said substrate;
    wherein in said diffusion plate, the light transmittance of a lamp corresponding part located in a vertical immediate downward direction of each of said plurality of lamps is lower than the light transmittance of an inter-lamp corresponding part located between said lamp corresponding parts adjacent to each other.

2. The thermal processing apparatus according to claim 1 wherein
    the light transmittance increases gradually from a central position of said lamp corresponding part to a central position of said inter-lamp corresponding part in said diffusion plate.

3. The thermal processing apparatus according to claim 1 wherein the light transmittance of an end corresponding part located outside space in a vertical immediate downward direction of an arrangement of said plurality of lamps in said diffusion plate is higher than the light transmittance of said lamp corresponding part.

4. A thermal processing apparatus to heat a substrate by irradiating light to said substrate, comprising:
    a light source consisting of a plurality of flash lamps arranged in a plane;
    a hold element to hold a substrate at a location below said light source; and
    a diffusion plate that is disposed between said light source and a substrate held by said hold element such that they are substantially parallel with one another, said diffusion plate diffusing light emitted from each of said plurality of flash lamps and directing it to said substrate, wherein
    in said diffusion plate, the light transmittance of a lamp corresponding part located in a vertical immediate downward direction of each of said flash lamps is lower than the light transmittance of an inter-lamp corresponding part located between said lamp corresponding parts adjacent to each other.

5. The thermal processing apparatus according to claim 4 wherein
    the light transmittance increases gradually from a central position of said lamp corresponding part to a central position of said inter-lamp corresponding part in said diffusion plate.

6. The thermal processing apparatus according to claim 4 wherein
    said diffusion plate is a glass plate in which a geometrical pattern in a ground glass state is formed in a region located above parts other than an edge part of a substrate held by said hold element.

7. The thermal processing apparatus according to claim 6 wherein said geometrical pattern is a stripe pattern.

8. The thermal processing apparatus according to claim 6 wherein said geometrical pattern is a parallel crosses pattern.

9. The thermal processing apparatus according to claim 6 wherein said said geometrical pattern is a woven bamboo pattern.

10. The thermal processing apparatus according to claim 4 wherein
    each of said flash lamps is a xenon flash lamp, and
    said hold element has an assist heating element to preheat a substrate to be held.

11. A thermal processing apparatus to heat a substrate by irradiating light to said substrate; comprising:
    a light source comprising a plurality of flash lamps arranged in a plane;
    a hold element to hold a substrate at a location below said light source; and
    a diffusion plate that is disposed between said light source and a substrate held by said hold element such that they are substantially parallel to one another, said diffusion plate diffusing light emitted from each of said plurality of flash lamps and directing it to said substrate;
    wherein in said diffusion plate, the light transmittance of a center corresponding part located in a vertical immediate downward direction of an arrangement of said plurality of flash lamps is lower than the light transmittance of an end corresponding part located outside said center corresponding part.

12. The thermal processing apparatus according to claim 11 wherein
    said diffusion plate is a glass plate in which a geometrical pattern in a ground glass state is formed in a region located above parts other than an edge part of a substrate held by said hold element.

13. The thermal processing apparatus according to claim 11 wherein
    each of said plurality of flash lamps is a xenon flash lamp, and
    said hold element has an assist heating element to preheat a substrate to be held.

* * * * *